(12) United States Patent
Sung et al.

(10) Patent No.: US 7,615,437 B2
(45) Date of Patent: Nov. 10, 2009

(54) NON-VOLATILE MEMORY DEVICE AND METHOD OF MANUFACTURING THE SAME

(75) Inventors: Suk-Kang Sung, Seongnam-si (KR); Kyu-Charn Park, Pyeongtaek-si (KR); Choong-Ho Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/153,071

(22) Filed: May 13, 2008

(65) Prior Publication Data

US 2008/0283902 A1 Nov. 20, 2008

(30) Foreign Application Priority Data

May 16, 2007 (KR) .................... 10-2007-0047383

(51) Int. Cl.
*H01L 21/8238* (2006.01)
(52) U.S. Cl. ................ 438/201; 438/257; 257/E21.179
(58) Field of Classification Search ................ 438/201, 438/211, 257, 258, 593; 257/E21.179, E21.422, 257/E21.68
See application file for complete search history.

(56) References Cited

U.S. PATENT DOCUMENTS

| 6,953,965 | B2 | 10/2005 | Goda et al. |
| 7,344,944 | B2 * | 3/2008 | Park et al. ................... 438/266 |
| 2006/0231822 | A1 | 10/2006 | Kim |

FOREIGN PATENT DOCUMENTS

| JP | 2004-014783 | 1/2004 |
| KR | 10-2006-0093160 A | 8/2006 |
| KR | 10-0614657 B1 | 8/2006 |

* cited by examiner

*Primary Examiner*—Hoai v Pham
(74) *Attorney, Agent, or Firm*—Lee & Morse, P.C.

(57) ABSTRACT

A method of manufacturing a non-volatile memory device includes sequentially depositing a first insulation layer, a charge storage layer, and a second insulation layer on a substrate, forming a first opening through the resultant structure to expose the substrate, forming second and third openings through the second insulation layer to form a second insulation layer pattern, forming a conductive layer on the second insulation layer pattern, forming a photoresist pattern structure on the conductive layer, and forming simultaneously a common source line, at least one ground selection line, at least one string selection line, and a plurality of gate structures on the substrate by etching through the photoresist pattern structure, wherein the common source line and the gate structures are formed simultaneously on a substantially same level and of substantially same components.

19 Claims, 15 Drawing Sheets

NON-VOLATILE MEMORY DEVICE AND METHOD OF MANUFACTURING THE SAME

BACKGROUND OF THE INVENTION

1. Field of the Invention

Example embodiments of the present invention relate to a non-volatile memory device and to a method of manufacturing the same. More particularly, example embodiments of the present invention relate to a method of manufacturing a non-volatile memory device with increased integration by simultaneously forming a common source line and gate structures.

2. Description of the Related Art

Semiconductor memory devices may be divided into volatile memory devices and non-volatile memory devices. The volatile memory devices, e.g., dynamic random access memory (DRAM) devices or static random access memory (SRAM) devices, may have a relatively rapid response speed but may lose stored data over time. On the other hand, the non-volatile memory devices, e.g., flash memory devices or electrically erasable programmable read only memory (EEPROM) devices, may store data for a long time but may have a relatively slow response speed. The non-volatile memory devices, e.g., flash memory device, may be employed in various electronic devices, e.g., cellular phones, MP3 players, USB memory devices, and so forth.

In a conventional flash memory device data may be electrically stored in or erased from the flash memory device through Fowler-Nordheim tunneling or channel hot electron injection. The flash memory device may be classified into a NAND type non-volatile memory device and a NOR type non-volatile memory device. In the NAND type non-volatile memory device, a plurality of cell transistors may be combined to provide a unit string, so the unit string may be connected in series between a bit line and a ground line. In the NOR type non-volatile memory device, each cell transistor may be connected in parallel between a bit line and a ground line.

A conventional cell transistor of the NAND type non-volatile memory device may include a plurality of gate structures, a common source line, and a contact. The common source line and the contact, however, may have different structures, so formation thereof may not be performed simultaneously via a single process. In particular, a first insulating interlayer may be formed on a substrate to cover the gate structures, and a common source line and a second insulating interlayer may be formed sequentially on the first insulating interlayer. A contact hole may be formed through the first and second insulating interlayers, followed by deposition of a conductive material in the contact hole to form a contact.

Formation of the contact hole by etching two insulating interlayers may result in a contact hole having an increased length, thereby having an increased aspect ratio. As such, the contact may not be properly formed in the contact hole, thereby reducing reliability and electrical characteristics of the conventional non-volatile memory device. In addition, formation of the contact hole by etching two insulating interlayers may increase manufacturing process time. Further, wiring lines adjacent to the contact hole may require increased distance therebetween to facilitate formation of the contact hole between the wiring lines, thereby reducing integration degree of the non-volatile memory device and complicating processes for manufacturing the non-volatile memory device.

SUMMARY OF THE INVENTION

Embodiments of the present invention are therefore directed to a method of manufacturing a non-volatile memory device, which substantially overcomes one or more of the disadvantages and shortcomings of the related art.

It is therefore a feature of an embodiment of the present invention to provide a method of manufacturing a non-volatile memory device having simultaneously formed a common source line and gate structures.

It is another feature of an embodiment of the present invention to provide a method of manufacturing a non-volatile memory device with an increased integration degree.

It is yet another feature of an embodiment of the present invention to provide a method of manufacturing a non-volatile memory device with an improved electrical stability.

It is still another feature of an embodiment of the present invention to provide a method of manufacturing a non-volatile memory device exhibiting a faster manufacturing time.

It is yet another feature of an embodiment of the present invention to provide a non-volatile memory device with a common source line and gate structures formed simultaneously to exhibit one or more of the above features.

At least one of the above and other features and advantages of the present invention may be realized by providing a method of manufacturing a non-volatile memory device, including forming a multi-layer structure on a substrate by sequentially depositing a first insulation layer, a charge storage layer, and a second insulation layer on the substrate, forming a first opening through the multi-layer structure to expose a first region of the substrate, the first opening being formed by partially etching the second insulation layer, the charge storage layer, and the first insulation layer, forming second and third openings through the second insulation layer to form a second insulation layer pattern, the second and third openings being formed in first and second sections of the substrate, respectively, and exposing portions of the charge storage layer, the first section of the substrate including the first region of the substrate, forming a conductive layer on the second insulation layer pattern, forming a photoresist pattern structure on the conductive layer, and forming simultaneously a common source line, at least one ground selection line, at least one string selection line, and a plurality of gate structures on the substrate by etching the conductive layer, the second insulation layer pattern, the charge storage layer, and the first insulation layer using the photoresist pattern structure as an etching mask, wherein the common source line may be formed in the first region of the substrate, the ground selection line may be formed in the first section and adjacent to the common source line, the string selection line is formed in the second section, and the gate structures may be in a central region of the substrate between the first and second section.

Forming the photoresist pattern structure may include forming a first photoresist film on the conductive layer, patterning the first photoresist film to form first photoresist patterns spaced apart by a first distance, forming a second photoresist film on the first photoresist patterns and on the conductive layer, and patterning the second photoresist film to form second photoresist patterns between the first photoresist patterns, such that an alternating pattern of the first and the second photoresist patterns may be formed, each first photoresist pattern being spaced apart from an adjacent second photoresist pattern by a second distance substantially smaller than the first distance. Each of the first and the second photoresist patterns may have a width corresponding to a resolution limit of a light used in patterning the first and the second photoresist films. The method may further include forming a reaction preventing layer on the conductive layer and on the first photoresist patterns before forming the second photoresist film. The reaction preventing layer may be formed by treating the first photoresist patterns with a hydrogen bromide (HBr) plasma. The method may further include treating the second photoresist patterns with a hydrogen bromide plasma. The method may further include forming spacers on sidewalls of the first photoresist patterns before forming the second photoresist film. Forming the spacers may include forming a spacer formation layer on the conductive layer to cover the first photoresist patterns, and anisotropically etching the spacer formation layer.

The method may further include implanting impurities into the first region of the substrate. Implanting the impurities may be performed before forming the first insulation layer. Implanting the impurities may be performed after forming the first opening. The first insulation layer may include silicon oxide. The charge storage layer may include polysilicon or amorphous silicon. The second insulation layer may include a silicon oxide, a silicon nitride, or a metal compound. The charge storage layer may include a silicon nitride or a metal compound having a dielectric constant substantially higher than that of a silicon oxide. The second insulation layer may include a silicon oxide, a silicon oxynitride, or a metal compound having a dielectric constant substantially higher than that of a silicon nitride. The second insulation layer may include a metal compound, the metal compound being an aluminum oxide. The method may further include forming an insulating interlayer on the substrate to cover the gate structures, the ground selection line, the string selection line, and the common source line, partially etching the insulating interlayer to form a contact hole exposing a portion of the substrate, and forming a contact in the contact hole. Forming the contact hole may include arranging the string selection line between the contact hole and the gate structures.

At least one of the above and other features and advantages of the present invention may be also realized by providing a non-volatile memory device, including a ground selection line on a substrate, a string selection line on the substrate and spaced apart from the ground selection line, first and second gate structures in an alternating pattern on the substrate between the ground selection line and the string selection line, the second gate structure having a different width than the first gate structure, and a common source line on the substrate, the ground selection line being between the common source line and the first gate structure, and the common source line being on a substantially same level and including substantially same components as the first and the second gate structures. Each of the first gate structures, the second gate structures, and the common source line may include a first insulation layer pattern on the substrate, a charge storage layer pattern on the first insulation layer pattern, a second insulation layer pattern on the charge storage layer pattern, and a conductive layer pattern on the second insulation layer pattern. The memory device may further include an insulating interlayer on the substrate to cover the common source line, the ground selection line, the string selection line, and the gate structures, and a contact through a portion of the insulating interlayer, the contact being adjacent to the string selection line.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
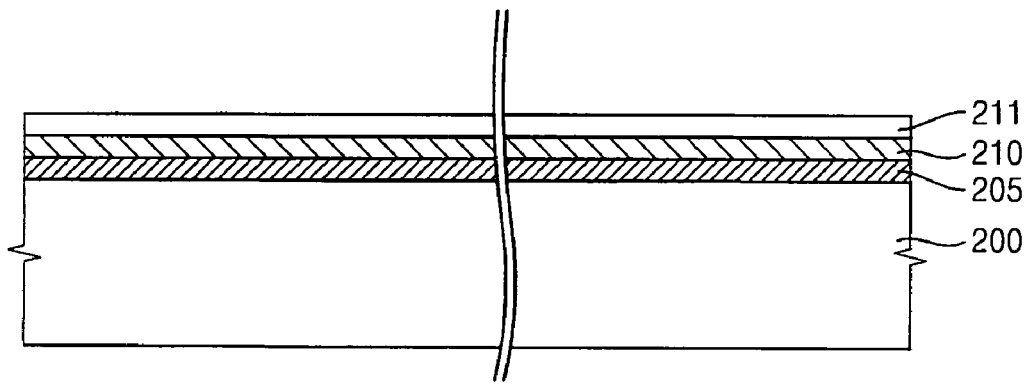
FIGS. 1-9 illustrate cross-sectional views of a method of manufacturing a non-volatile semiconductor device in accordance with an example embodiment of the present invention.

Korean Patent Application No. 10-2007-0047383, filed on May 16, 2007, in the Korean Intellectual Property Office, and entitled: "Methods of Manufacturing Non-Volatile Memory Devices," is incorporated by reference herein in its entirety.

Exemplary embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate solely a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Further, it will be understood that when an element and/or layer is referred to as being "connected to" or "coupled to" another element and/or layer, it can be directly connected or coupled to the other element and/or layer, or intervening elements and/or layers may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments of the present invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1-9 illustrate cross-sectional views of stages in a method of manufacturing a non-volatile semiconductor device in accordance with example embodiments of the present invention. It is noted that even though FIGS. 1-9 illustrate a method of manufacturing a floating gate type non-volatile semiconductor memory device, i.e., where charges may be injected into a floating gate and removed from the floating gate during programming/era sing operation, other types of non-volatile semiconductor memory devices, e.g., a charge trapping type non-volatile semiconductor memory device, are within the scope of the present invention.

Referring to FIG. 1, a first insulation layer 205 may be formed on a semiconductor substrate 200. The semiconductor substrate 200 may be, e.g., a silicon substrate, a germanium substrate, a silicon-on-insulator (SOI) substrate, a germanium-on-insulator (GOI) substrate, and so forth. The first insulation layer 205 may function as a tunnel insulation layer of the non-volatile semiconductor device. The first insulation layer 205 may be formed of an oxide, e.g., a silicon oxide, or of a high-k material, e.g., a metal oxide having a dielectric constant substantially higher than that of a silicon oxide. The first insulation layer 205 may have a thickness of about 20 angstroms to about 80 angstroms. The first insulation layer 205 may be formed by, e.g., a thermal oxidation process, a chemical vapor deposition (CVD) process, an atomic layer deposition (ALD) process, a plasma enhanced (PE) CVD process, a high density plasma (HDP) CVD process, and so forth.

A charge storage layer 210 may be formed on the first insulation layer 205. The charge storage layer 210 may be formed of a silicon containing material, e.g., polysilicon or amorphous silicon, to have a thickness of about 20 angstroms to about 120 angstroms. In the floating gate type non-volatile semiconductor memory device, the charge storage layer 210 may function as a floating gate.

A second insulation layer 211 may be formed on the charge storage layer 210. The second insulation layer 211 may have a multi layer structure, e.g., the second insulation layer 211 may include a lower oxide film, a nitride film, and an upper oxide film. Accordingly, the second insulation layer 211 may have an oxide/nitride/oxide (ONO) structure. For example, the second insulation layer 211 may include a lower silicon oxide film, a silicon nitride film, and an upper silicon oxide film. Alternatively, the second insulation layer 211 may be formed using a metal compound having a high dielectric constant, e.g., one or more of hafnium oxide ($HfO_x$), titanium oxide ($TiO_x$), tantalum oxide ($TaO_x$), zirconium oxide ($ZrO_x$), hafnium silicate ($HfSi_xO_y$), zirconium silicate ($ZrSi_xO_y$), and so forth.

Figure 2:
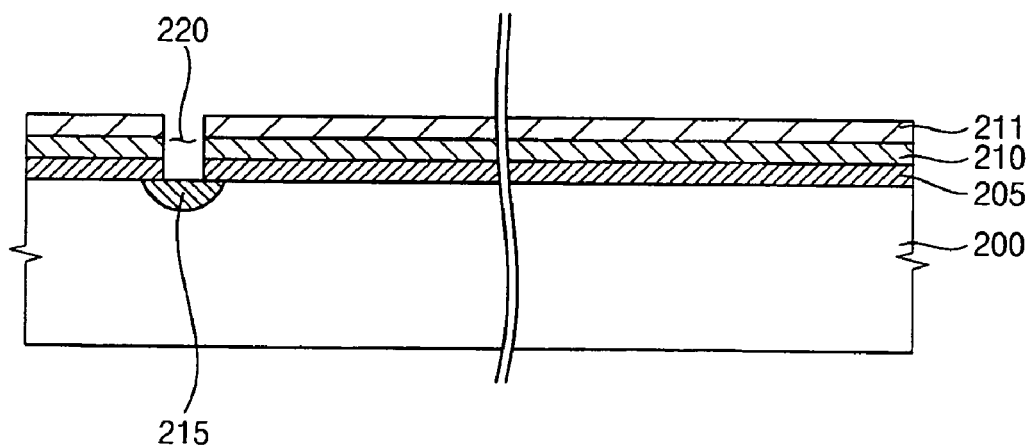

Referring to FIG. 2, portions of the second insulation layer 211, the charge storage layer 210, and the first insulation layer 205 may be removed to form a first opening 220. For example, a mask (not illustrated) may be formed on the second insulation layer 211, so the second insulation layer 211, the charge storage layer 210, and the first insulation layer 205 may be partially etched through the mask. Thus, the first opening 220 may be formed through the second insulation layer 211, the charge storage layer 210, and the first insulation layer 205 to expose a portion of an upper surface of the substrate 200. The portion of the upper surface of the substrate 200 exposed by the first opening 220, as illustrated in FIG. 2, may be doped with impurities, e.g., N-type impurities, by an ion implantation process to form a first region 215 of the semiconductor substrate 200. A common source line 350 may be positioned on the first region 215, as will be discussed in more detail below with reference to FIG. 8.

Figure 3:
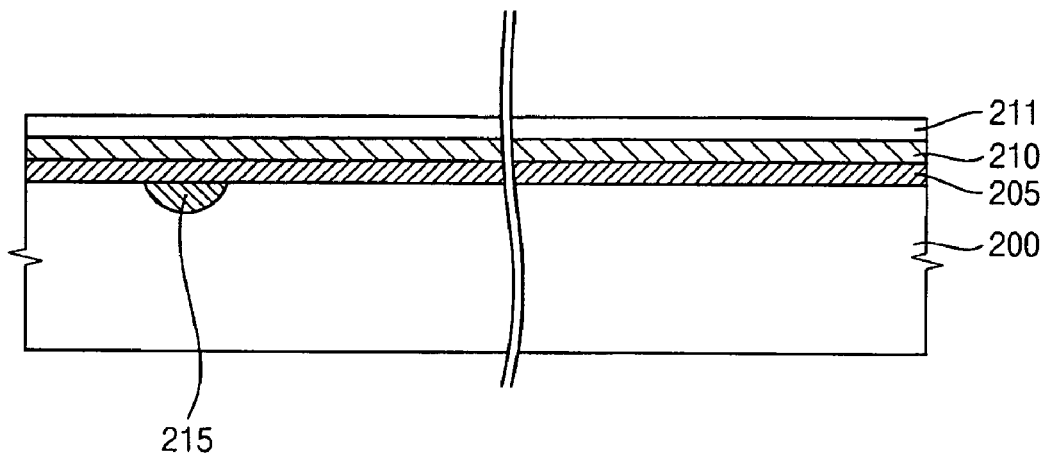
Figure 4:
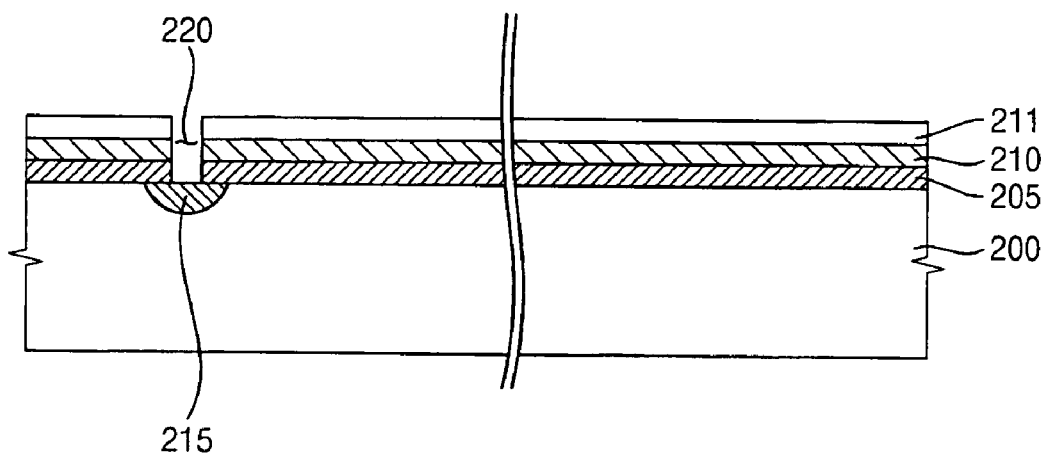

As illustrated in FIGS. 1-2, the first region 215 may be formed in the semiconductor substrate 200 after formation of the opening 220. Alternatively, as illustrated in FIGS. 3-4, the first region 215 may be formed in a predetermined region of the semiconductor substrate 200 before forming the first insulation layer 210 on the semiconductor substrate 200. Accordingly, the first insulation layer 205, the charge storage layer 210, and the second insulation layer 211 may be sequentially formed on the semiconductor substrate 200 to cover the first region 215, so the second insulation layer 211, the charge storage layer 210, and the first insulation layer 205 may be partially etched to form the opening 220 to expose an upper surface of the first region 215. In yet another alternative, the first region 215 may be formed after forming the first insulation layer 205 and/or the charge storage layer 210, so the first opening 220 may be formed after forming the first insulation layer 205 and/or the charge storage layer 210 by partially etching the first insulation layer 205 and/or the charge storage layer 210.

Figure 5:
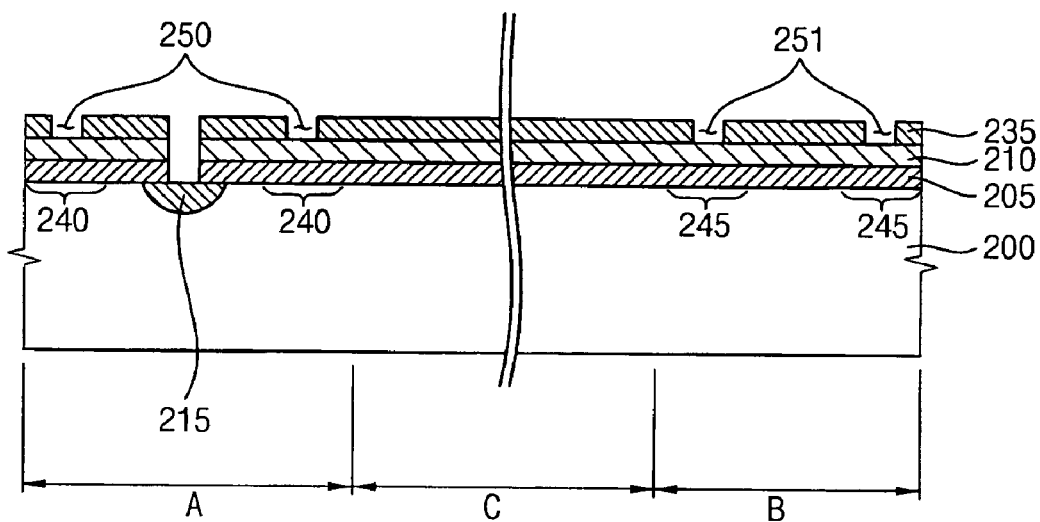

Referring to FIG. 5, the second insulation layer 211 may be etched to form a second insulation layer pattern 235 on the charge storage layer 210. The second insulation layer pattern 235 may separate a ground selection line 360 (see FIG. 8) from a string selection line 370 (see FIG. 8).

In an example embodiment, the second insulation layer pattern 235 may include a plurality of portions spaced part from each other on the charge storage layer 210, so second openings 250 and third openings 251 may be provided between adjacent portions of the second insulation layer pattern 235. As illustrated in FIG. 5, the second openings 250 may be formed in a first section A of the semiconductor memory device, and may expose portions of an upper surface of the charge storage layer 210 to define second regions 240 in the semiconductor substrate 200. As further illustrated in FIG. 5, the first opening 215 may be in the first section A of the semiconductor memory device, and may be between two adjacent second openings 250. As illustrated in FIG. 5, the third openings 251 may be formed in a second section B of the semiconductor memory device, and may expose portions of an upper surface of the charge storage layer 210 to define third regions 245 of the semiconductor substrate 200. As illustrated in FIG. 5, the second and the third regions 240 and 245 of the semiconductor substrate 200 may be under and completely overlap the second and the third openings 250 and 251, respectively. The ground selection lines 360 and the string selection lines 370 may be formed in the second regions 240 and in the third regions 245, respectively, as will be discussed in more detail below with reference to FIG. 8.

Figure 6:
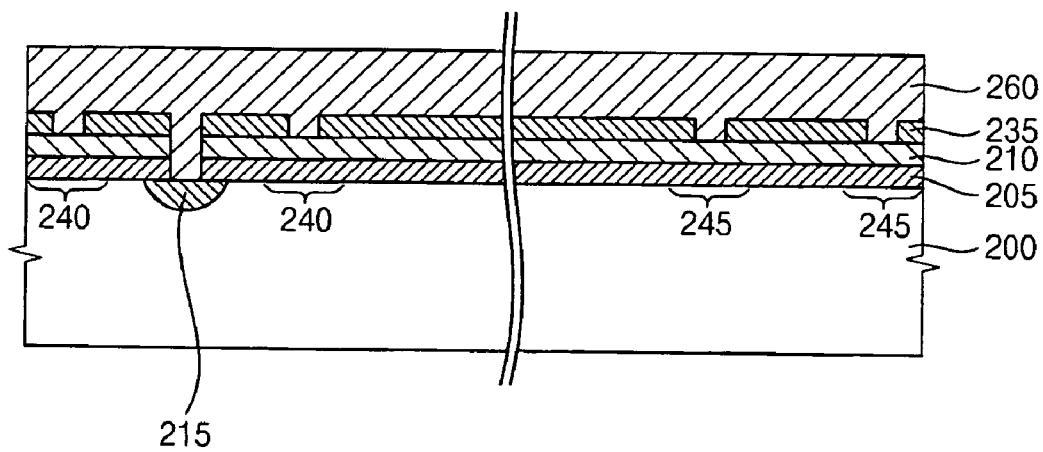

Referring to FIG. 6, a conductive layer 260 may be formed on the second insulation layer pattern 235 to fill the first, the second, and the third openings 220, 250, and 251. More specifically, the conductive layer 260 may be deposited on an upper surface of the second insulation layer pattern 235 to a predetermined thickness, and may be deposited inside the first, the second, and the third openings 220, 250, and 251 to be in contact with the first region 215 of the semiconductor substrate 200 and with corresponding portions of the charge storage layer 210 in the second and the third regions 240 and 245. The predetermined thickness of the conductive layer 260 may be sufficient to cover the second insulation layer pattern 235. The conductive layer 260 may be formed of, e.g., a metal oxide, a metal nitride, and/or a metal oxynitride, by, e.g., a CVD process, an ALD process, a sputtering process, a pulsed laser deposition (PLD) process, an evaporation process, and so forth. For example, the conductive layer 260 may extend along a direction substantially perpendicular to a direction of a gate structure 300 on an active region of the semiconductor substrate 200, as illustrated in FIG. 8.

Figure 7:
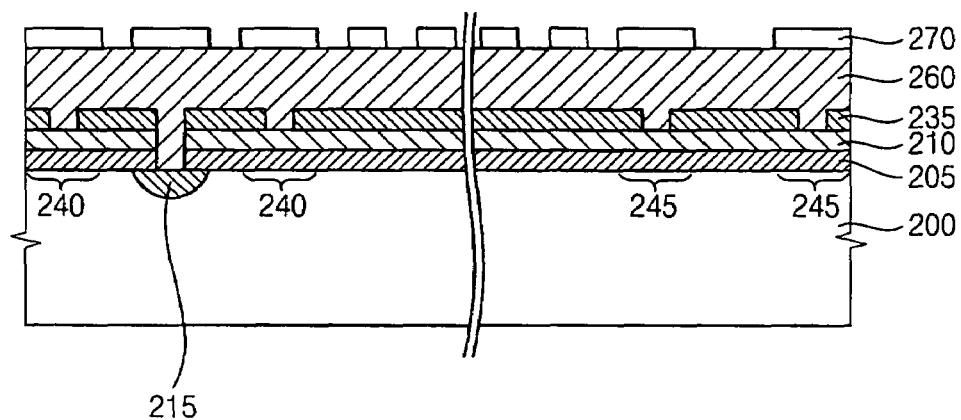

Referring to FIG. 7, a photoresist pattern structure 270 may be formed on the conductive layer 260. The photoresist pattern structure 270 may include a plurality of portions spaced apart from each other, and may be formed by a double patterning process to provide fine pitch thereto. Formation of the photoresist pattern structure 270 via the double patterning method may facilitate fabrication of elements with a fine pitch and will be explained in more detail below with reference to FIGS. 10-22.

Figure 8:
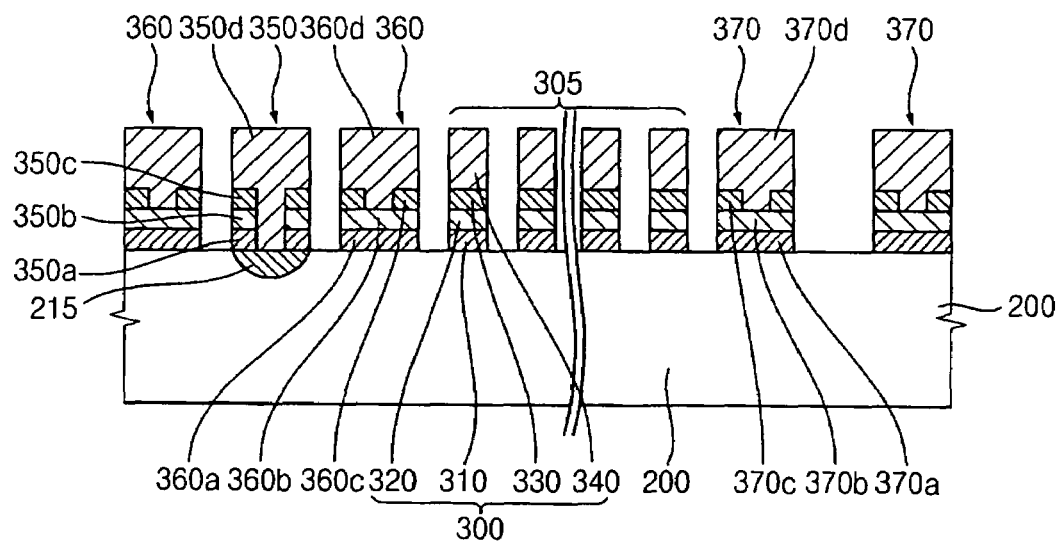

Referring to FIG. 8, the conductive layer 260, the second insulation layer pattern 235, the charge storage layer 210, and the first insulation layer 205 may be etched through the photoresist pattern structure 270 using the photoresist pattern structure 270 as an etching mask. For example, portions of the conductive layer 260, the second insulation layer pattern 235, the charge storage layer 210, and the first insulation layer 205 may be removed to expose portions of the upper surface of the semiconductor substrate 200. The gate structure 300, the common source line 350, the ground selection lines 360, and the string selection lines 370 may be defined between exposed portions of the upper surface of the semiconductor substrate 200. In an example embodiment, the gate structure 300, the common source line 350, the ground selection lines 360, and the string selection lines 370 may be formed simultaneously on the semiconductor substrate 200.

For example, a plurality of gate structures 300 may be formed in a fourth region 305, e.g., a central portion C of the semiconductor substrate 200 illustrated in FIG. 5. Each of the gate structures 300 may include a first insulation film 310, a floating gate 320, a charge storage film 330, and a control gate 340. Each first insulation film 310 may be a portion of the first insulation layer 205, and may function as a tunnel insulation layer. Each charge storage film 330 may be a portion of the second insulation pattern 235, and may function as a dielectric layer. Each floating gate 320 may be a portion of the charge storage layer 210, and may function as a gate electrode. Each control gate 340 may be a portion of the conductive layer 260, and may function as a word line. The gate structures 300 may be spaced apart from each other, so distances between adjacent gate structures 300 may correspond to distances between adjacent portions of the photoresist pattern structure 270.

The ground selection lines 360 and the string selection lines 370 may be formed at opposite sides of the semiconductor substrate 200 with all the gate structures 300 therebetween. In other words, the ground selection lines 360 may be formed at a first side of the fourth region 305, i.e., in the first section A, and the string selection lines 370 may be formed at a second side of the fourth region 305, i.e., in the second section B opposite the first section A. The common source line 350 may be formed at the first side of the fourth region 305 between two adjacent ground selection lines 360.

The common source line 350 may include a first pattern 350a, a second pattern 350b, a third pattern 350c, and a fourth pattern 350d. The first to the fourth patterns 350a to 350d of the common source line 350 may respectively correspond to and be formed simultaneously with the first insulation film 310, the floating gate 320, the charge storage film 330, and the control gate 340 of each gate structure 300. The first, the second, and the third patterns 350a, 350b, and 350c may be adjacent to the first opening 220, and may be formed by etching the first insulation layer 205, the charge storage layer 210, and the second insulation layer pattern 235, respectively. The fourth pattern 350d may be formed by partially etching the conductive layer 260. Since the conductive layer 260 is completely filling up the first opening 220, the fourth pattern 350d may be in direct contact with the first area 215 having the impurities. Thus, the second and the fourth patterns 350b and 350d of the common source line 350 and the first region 215 may be electrically connected to each other. A voltage may be applied to the gate structures 300 through the common source line 350, e.g., the common source line 350 may function as a pad for the gate structures 300.

Each ground selection line 360 may include a fifth pattern 360a, a sixth pattern 360b, a seventh pattern 360c, and an eighth pattern 360d. The fifth to the eight patterns 360a to 360d of the ground selection line 360 may respectively correspond to and be formed simultaneously with the first insulation film 310, the floating gate 320, the charge storage film 330, and the control gate 340 of each gate structure 300. The fifth and the sixth patterns 360a and 360b may be formed by etching the first insulation layer 205 and the charge storage layer 210, respectively. The seventh and the eighth patterns 360c and 360d may be formed by partially etching the second insulation layer pattern 235 and the conductive layer 260, respectively, to form the second openings 250. Since the conductive layer 260 is completely filling up the second openings 250, the eighth pattern 360d may be in direct contact with the sixth pattern 360b. The ground selection lines 360 may function as switching elements, e.g., transistors. For example, when the semiconductor device operates in a write operation, the ground selection lines 360 may cure failures generated during the operation of the semiconductor device.

Each string selection line 370 may include a ninth pattern 370a, a tenth pattern 370b, an eleventh pattern 370c, and a twelfth pattern 370d. The ninth to the twelfth patterns 370a to 370d of the string selection line 370 may respectively correspond to and be formed simultaneously with the first insulation film 310, the floating gate 320, the charge storage film 330, and the control gate 340 of each gate structure 300. The ninth pattern 370a and the tenth pattern 370b may be formed by etching the first insulation layer 205 and the charge storage layer 210, respectively. The eleventh pattern 370c and the twelfth pattern 370d may be formed by partially etching the second insulation layer pattern 235 and the conductive layer 260, respectively, to form the third openings 251. Since the conductive layer 260 is completely filling up the third openings 251, the twelfth pattern 370d may be in direct contact with the tenth pattern 370b. The string selection lines 370 may function as switching elements, e.g., transistors. For example, the string selection line 370 may select a gate electrode of a cell transistor in a reading operation of the semiconductor device.

Once the gate structures 300, the common source line 350, the ground selection lines 360, and the string selection lines 370 are formed, the photoresist pattern structure 270 may be removed by an ashing process and/or a stripping process. Alternatively, the photoresist pattern structure 270 may be consumed in the etching process during formation of the gate structures 300, the common source line 350, the ground selection lines 360, and the string selection lines 370.

Figure 9:
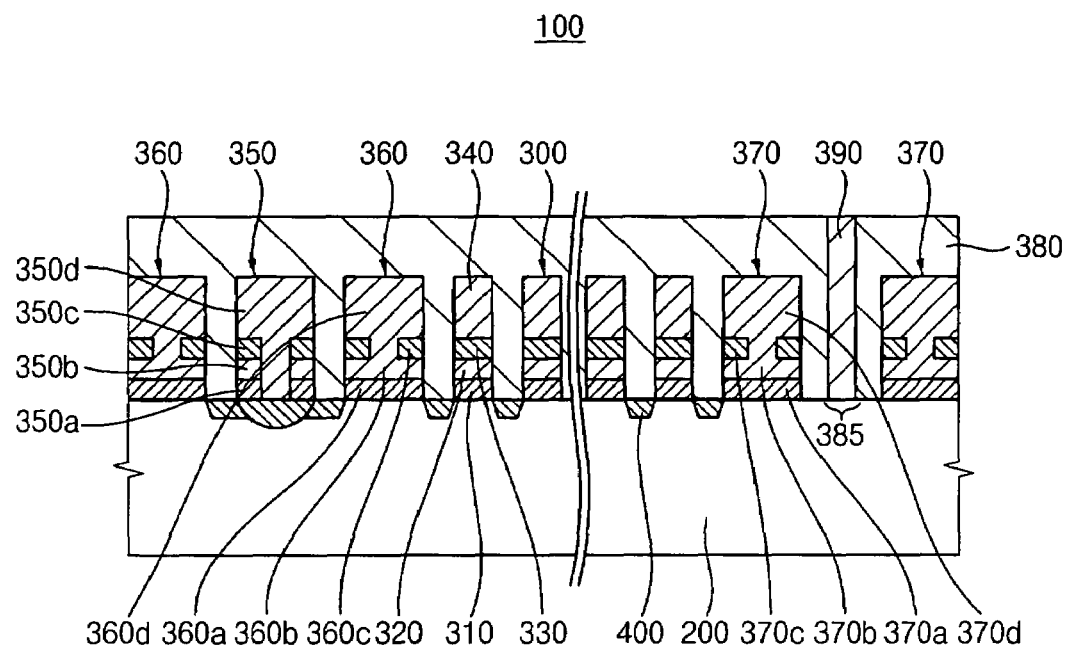

Referring to FIG. 9, source/drain regions 400 may be formed in portions of the semiconductor substrate 200 adjacent to the gate structures 300. For example, the source/drain regions 400 may be formed by implanting impurities into portions of the upper surface of the semiconductor substrate 200 adjacent to the gate structures 300. For example, as illustrated in FIG. 9, one source/drain region 400 may be in the semiconductor substrate 200 between two adjacent gate structures 300. In addition, the source/drain regions 400 may be formed between the common source line 350 and an adjacent ground selection line 360. For example, the source/drain regions 400 between the common source line 350 and the ground selection lines 360 may be in contact with the first region 215, as illustrated in FIG. 9.

As further illustrated in FIG. 9, an insulating interlayer 380 may be formed on the semiconductor substrate 200 to completely cover the gate structures 300, the common source line 350, the ground selection lines 360, and the string selection lines 370. The insulating interlayer 380 may be formed using an oxide, e.g., a silicon oxide. For example, the insulating interlayer 380 may be formed using undoped silicate glass (USG), spin on glass (SOG), boro-phosphor silicate glass (BPSG), flowable oxide (FOX), tetraethylorthosilicate (TEOS), plasma enhanced-TEOS (PE-TEOS), high density plasma-chemical vapor deposition (HDP-CVD) oxide, and so forth. Alternatively, the insulating interlayer 380 may be formed of, e.g., an organic insulating material.

The insulating interlayer 380 may be partially etched to form a contact hole (not illustrated) therethrough to expose a fifth region 385 of the semiconductor substrate 200. For example, the contact hole may be in the second region B of the semiconductor substrate 200, and may expose a portion of the upper surface of the semiconductor substrate 200 between adjacent string selection lines 370.

A conductive layer (not illustrated) may be formed on the insulating interlayer 380 to fill up the contact hole, followed by removal of the conductive layer to expose an upper surface of the insulating interlayer 380 and to form a contact 390 in the contact hole, as illustrated in FIG. 9. The conductive layer may be removed by a chemical mechanical polishing (CMP) process and/or an etch back process. Further, the contact 390 may include doped polysilicon, a metal and/or a metal compound. For example, the contact 390 may be formed using tungsten (W), tungsten nitride ($WN_x$), titanium (Ti), titanium nitride ($TiN_x$), tantalum (Ta), tantalum nitride ($TaN_x$), aluminum (Al), aluminum nitride ($AlN_x$), etc. The contact 390 may function as a pad for applying external power to the gate structures 300, the common source line 350, the ground selection line 360, and the string selection line 379. As a result, a non-volatile memory device 100 may be provided on the semiconductor substrate 200.

In the conventional method of manufacturing a non-volatile memory device, a first horizontal insulating interlayer may be formed on the substrate to cover gate structures, so a common source line and a second horizontal insulating interlayer may be formed sequentially on the first horizontal insulating interlayer. Accordingly, a contact may be formed through two insulating interlayers, thereby requiring longer contact hole. Hence, the conventional contact hole may have a higher aspect ratio, so the conventional contact may be formed improperly on the substrate causing deteriorated reliability and electrical characteristics of the conventional non-volatile memory device. The non-volatile memory device according to embodiments of the present invention, however, may provide the common source line 350, the gate structures 300, the ground selection line 360, and the string selecting line 370 simultaneously on the semiconductor substrate 200, so only a single insulating interlayer may cover the common source line 350, the gate structures 300, the ground selection line 360, and the string selecting line 370. Thus, a contact hole may be formed through a single insulating layer, i.e., the insulating interlayer 380, thereby providing a proper contact 390 in the non-volatile memory device 100. Formation of the contact 390 through a single insulating layer according to embodiments of the present invention may provide a non-volatile memory device with improved reliability and electrical characteristics. Further, processing time and manufacturing costs of the non-volatile memory device 100 may be substantially reduced.

Hereinafter, formation of a photoresist pattern structure by a double patterning process will be described with reference to the accompanying drawings. FIGS. 10 to 13 illustrate cross-sectional views of a process of forming the photoresist pattern structure 270 on the conductive layer 260 according to example embodiments of the present invention.

Figure 10:
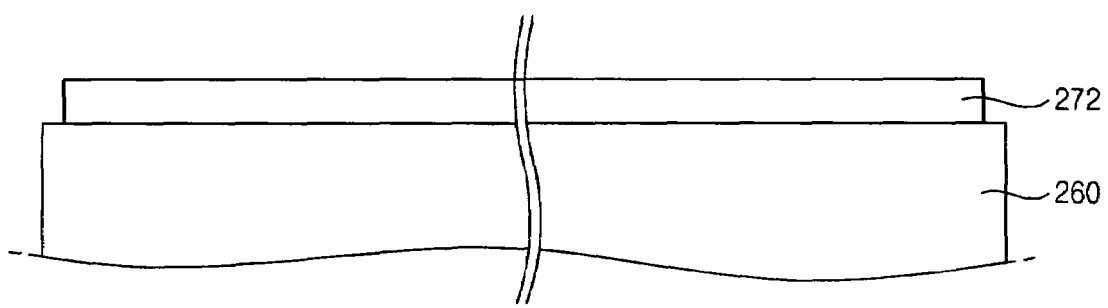
FIGS. 10-13 illustrate cross-sectional views of a process of forming a photoresist pattern structure in accordance with an example embodiment of the present invention.
Figure 11:
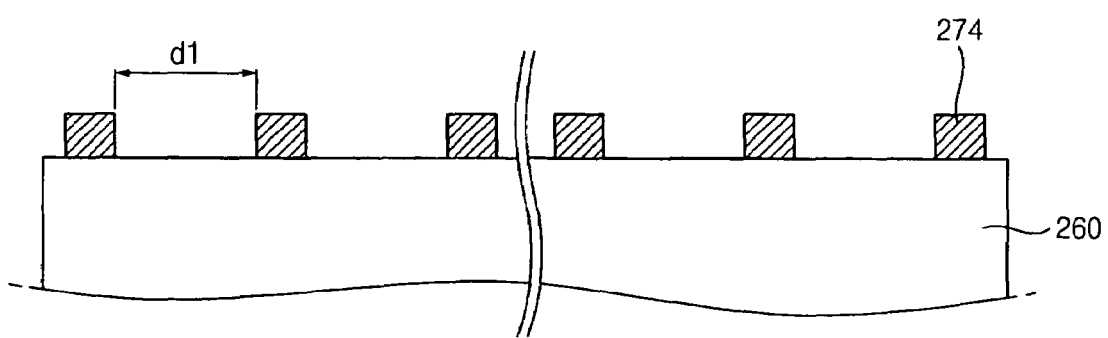

Referring to FIG. 10, a first photoresist film 272 may be formed on the conductive layer 260 by, e.g., a spin coating process, to have a substantially uniform thickness along a vertical direction, i.e., as measured from an upper surface of the conductive layer 260 in an upward direction. Next, as illustrated in FIG. 11, the first photoresist film 272 may be patterned to form first photoresist patterns 274 through an exposure step and a developing step. The first photoresist patterns 274 may be separated by a first distance d1, as further illustrated in FIG. 11. More specifically, each of the first photoresist patterns 274 may have a width substantially corresponding to a resolution limit of a light used in the exposure step. Thus, the first distance d1 between the first photoresist patterns 274 may also be determined by the resolution limit of the light. The first distance d1 between the first photoresist patterns 274 may be substantially greater than the widths of the first photoresist patterns 274.

Figure 12:
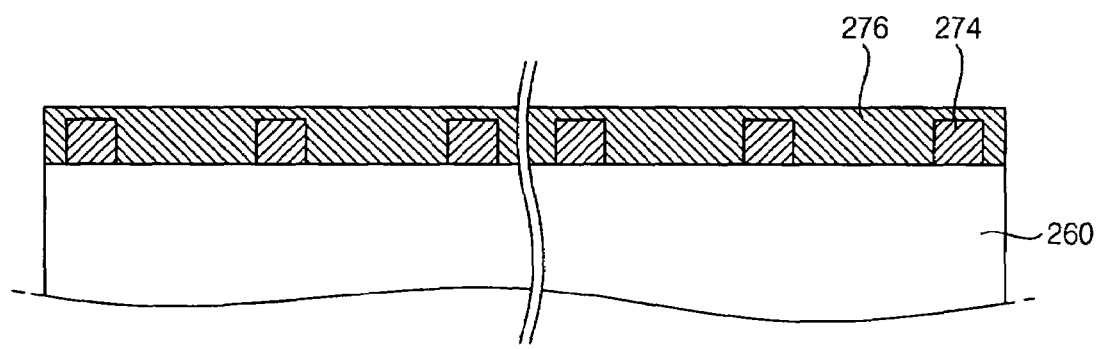

Referring to FIG. 12, a second photoresist film 276 may be formed on the conductive layer 260. For example, the second photoresist film 276 may cover the first photoresist patterns 274, i.e., substantially cover upper surfaces of the first photoresist patterns 274 and gaps between adjacent first photoresist patterns 274. Accordingly, as illustrated in FIG. 12, the second photoresist film 276 may be thicker than the first photoresist patterns 274 along the vertical direction, i.e., an upper surface of the second photoresist film 276 may be higher than an upper surfaces of the first photoresist patterns 274 relatively to the upper surface of the conductive layer 260. Alternatively, the second photoresist film 276 may have a substantially same thickness as the first photoresist patterns 274, i.e., the upper surface of the second photoresist film 276 may be substantially level with the upper surfaces of the first photoresist patterns 274.

Figure 13:
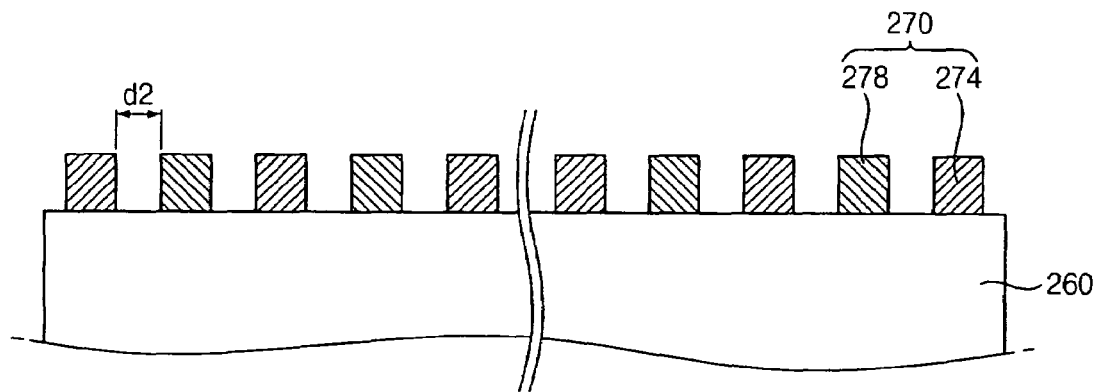

Referring to FIG. 13, the second photoresist film 276 may be patterned to form second photoresist patterns 278 on the conductive layer 260, so each of the second photoresist patterns 278 may be disposed between two adjacent first photoresist patterns 274. Each of the first photoresist patterns 274 may be separated from an adjacent second photoresist pattern 278 by a second distance d2. The second distance d2 may be substantially smaller than the first distance d1. For example, the second distance d2 may be substantially the same as or smaller than the widths of the first photoresist patterns 274 in accordance with a composition of the first photoresist film 272 and a type and wavelength of the light employed in patterning the first photoresist film 272.

The first and the second photoresist patterns 274 and 278 may have an alternating pattern, i.e., each second photoresist pattern 278 may be between two first photoresist patterns 274, and may form the photoresist pattern structure 270 with the second distance d2 therebetween. It is noted that the second photoresist patterns 278 may also have widths substantially corresponding to a resolution limit of light employed in patterning the second photoresist film 276, so distances therebetween may be substantially larger than the resolution limit of the light employed. Accordingly, the photoresist pattern structure 270 may include portions having substantially fine pitch, i.e., substantially same as or smaller than the resolution limit of the light.

Formation of a photoresist pattern with a fine line width or pitch by a conventional photolithography process may have a resolution limit of light employed in an exposure process, so obtaining fine pitch may be difficult. Formation of the photoresist pattern structure 270 via the double patterning method, however, may facilitate fabrication of elements with a fine pitch. For example, the photoresist pattern structure 270 may be used as an etching mask to form the gate structures 300 with a fine pitch, thereby improving an integration degree of the non-volatile memory device 100, i.e., each of the gate structures 300 may have a desired width in accordance with a minute design rule of the non-volatile memory device 100.

FIGS. 14 to 17 illustrate cross-sectional views of a process of forming the photoresist pattern structure 270 on the conductive layer 260 according to another example embodiment of the present invention.

Figure 14:
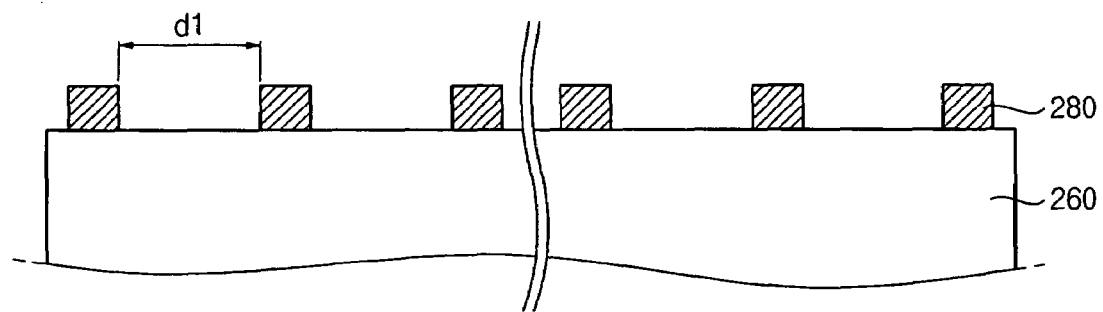
FIGS. 14-17 illustrate cross-sectional views of a process of forming a photoresist pattern structure in accordance with another example embodiment of the present invention.

Referring to FIG. 14, a first photoresist film (not illustrated) may be formed on the conductive layer 260 by, e.g., a spin coating process, to have a substantially uniform thickness. The first photoresist film may be patterned by an exposure step and a developing step to provide first photoresist patterns 280 on the conductive layer 260. Adjacent first photoresist patterns 280 may be spaced apart by a first distance d1. Although each of the first photoresist patterns 280 may have a width substantially corresponding to a resolution limit of a light used in patterning the photoresist film, the first distance d1 may be substantially larger than the resolution limit of the light.

Figure 15:
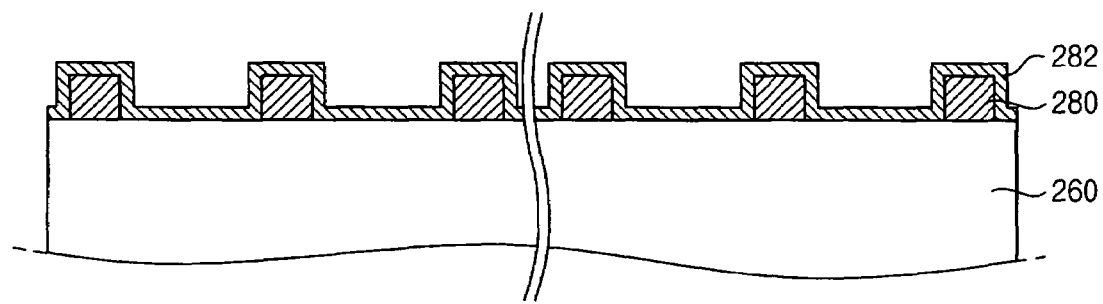

Referring to FIG. 15, a reaction preventing layer 282 may be formed on the first photoresist patterns 280 and on the conductive layer 260. For example, the reaction preventing layer 282 may be conformally formed along profiles of the first photoresist patterns 280 and the conductive layer 260 to separate the first photoresist patterns 280 from second photoresist patterns 284 formed in a subsequent process (see FIG. 16). For example, the reaction preventing layer 282 may prevent the first photoresist patterns 280 from reacting with light used in forming the second photoresist patterns 284.

The reaction preventing layer 282 may be formed by treating the first photoresist patterns 280 and the conductive layer 260. For example, the reaction preventing layer 282 may be formed on the first photoresist patterns 280 and on the conductive layer 260 by generating a plasma, e.g., a hydrogen bromide (HBr) plasma, over the first photoresist patterns 280 and over the conductive layer 260 after loading the substrate 200 into a process chamber (not illustrated). The reaction preventing layer 282 may include a polymer, i.e., a polymer generated during the plasma treatment. Alternatively, the reaction preventing layer 282 may correspond to portions of the first photoresist patterns 280 and the conductive layer 260 hardened in response to the plasma treatment. A thickness of the reaction preventing layer 282 may vary according to a process time of the plasma treatment. For example, the thickness of the reaction preventing layer 282 may increase as the process time of the plasma treatment increases.

Figure 16:
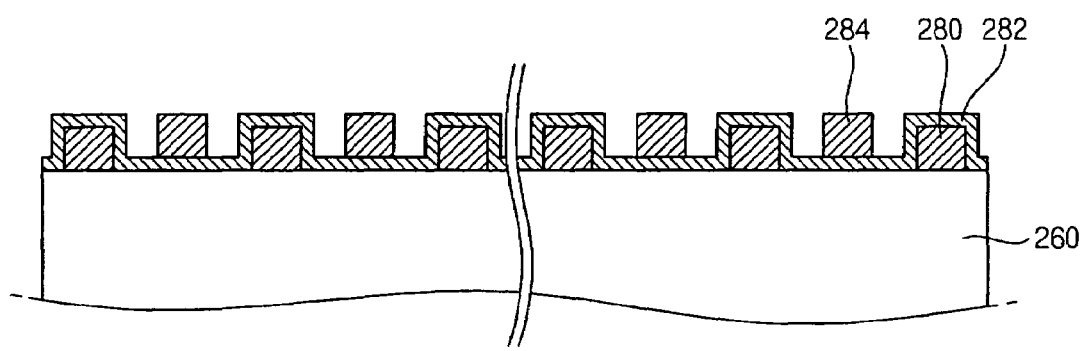

Referring to FIG. 16, a second photoresist film (not illustrated) may be formed on an entire upper surface of the reaction preventing layer 282. The second photoresist film may be patterned to form the second photoresist patterns 284 between the first photoresist patterns 280. As illustrated in FIG. 16, each second photoresist pattern 284 may be on a corresponding portion of the reaction preventing layer 282 and between two adjacent first photoresist patterns 280.

As illustrated in FIG. 16, the reaction preventing layer 282 may shield the first photoresist patterns 280, so light used in forming the second photoresist patterns 284 may not affect the first photoresist patterns 280. Thus, a thickness, a shape, and a height of each first photoresist pattern 280 may be advantageously maintained because of the reaction preventing layer 282. Portions of the reaction preventing layer 282 between the first and the second photoresist patterns 280 and 284 may be exposed.

Figure 17:
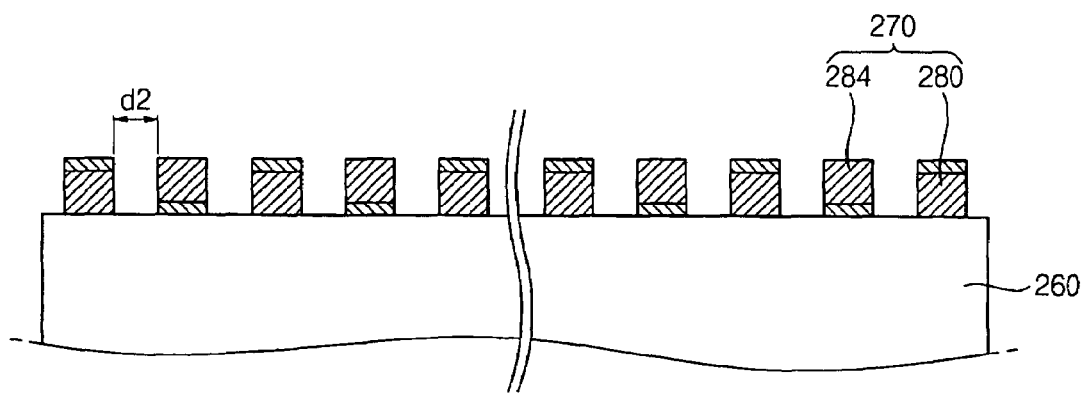

Referring to FIG. 17, the exposed portions of the reaction preventing layer 280 may be removed form the conductive layer 260 by, e.g., an ashing process and/or a stripping process. Once the exposed portions of the reaction preventing layer 280 are removed, the photoresist pattern structure 270 including the alternating first and the second photoresist patterns 280 and 284 may be obtained. Each of the second photoresist patterns 284 may be separated from an adjacent first photoresist pattern 280 by the second distance d2. As described above, distances between adjacent first photoresist patterns 280 or between adjacent second photoresist patterns 284 may be substantially larger than a resolution limit of light employed in patterning either of the first or second photoresist films, although each of the first and the second photoresist patterns 280 and 284 may have a width substantially corresponding to the resolution limit of the light. The second distance d2 may be substantially smaller than the first distance d1. Accordingly, the photoresist pattern structure 270 may have a fine pitch substantially smaller than the resolution limit of the light by the double patterning process as described above.

FIGS. 18 to 22 illustrate cross-sectional views of a process of forming the photoresist pattern structure 270 on the conductive layer 260 according to yet another example embodiment of the present invention.

Figure 18:
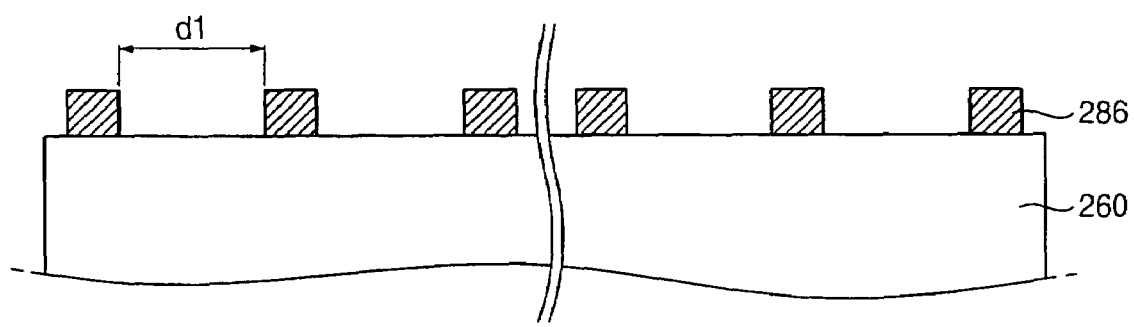
FIGS. 18-22 illustrate cross-sectional views of a process of forming a photoresist pattern structure in accordance with another example embodiment of the present invention.

Referring to FIG. 18, first photoresist patterns 286 separated by a first distance d1 may be formed on the conductive layer 260. Formation method and structure of the first photoresist patterns 286 may be substantially similar to the first photoresist patterns 274 and 280 described previously with reference to FIGS. 10 and 14, respectively, and therefore, will not be repeated.

Figure 19:
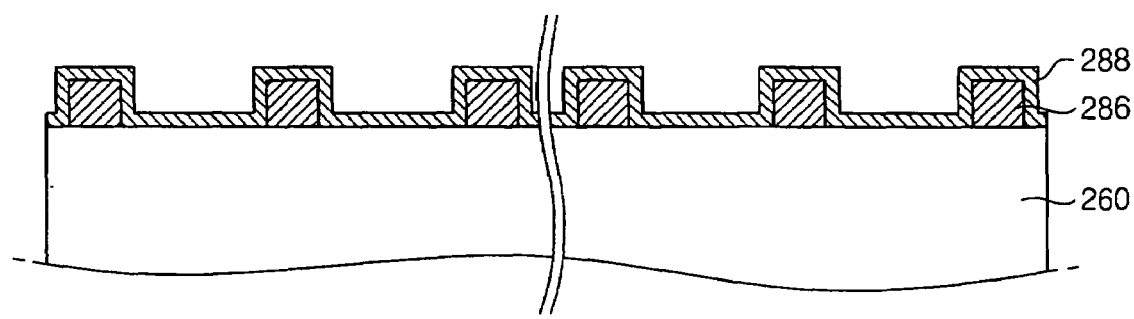

Referring to FIG. 19, a spacer formation layer 288 may be formed on the first photoresist patterns 286 and on the conductive layer 260. The spacer formation layer 288 may be conformally formed on the conductive layer 260 and on the first photoresist patterns 286. The spacer formation layer 288 may be formed of a nitride, e.g., silicon nitride. A thickness of the spacer formation layer 288 may be determined by widths of spacers 290 (see FIG. 20), and may vary according to the first distance d1 and a second distance d2 (see FIG. 20). For example, the thickness of the spacer formation layer 288 may increase when the first distance d1 and/or the second distance d2 are relatively large. In another example embodiment, the thickness of the spacer formation layer 288 may decrease when the first distance d1 and/or the second distance d2 are relatively small. Thus, the widths of the spacers 290 and a pitch of the photoresist pattern structure 270 may be advantageously controlled by the spacer formation layer 288.

Figure 20:
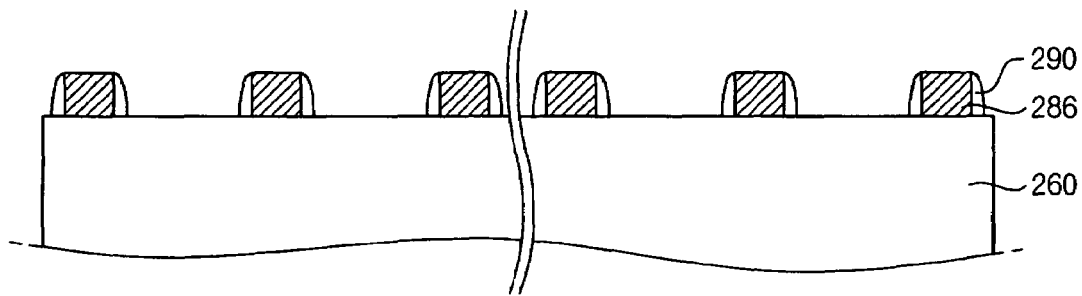

Referring to FIG. 20, the spacer formation layer 288 may be partially etched to form the spacers 290 on sidewalls of the first photoresist patterns 286. The spacers 290 may be formed by, e.g., an anisotropic etching process. A width of each of the spacers 290, i.e., a horizontal distance as measured from a contact surface between each spacer 290 and a corresponding first photoresist pattern 286 to an outer surface of the spacer 290, may vary in accordance with process conditions of the etching process, e.g., a processing time, a type of an etchant, a processing temperature, and so forth.

Figure 21:
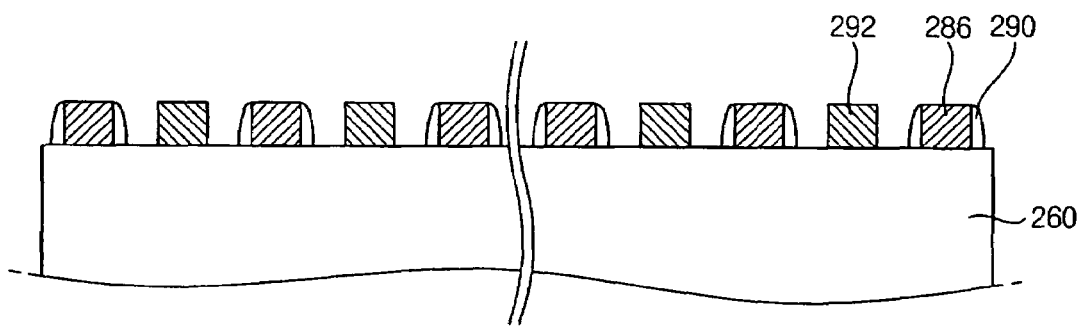

Referring to FIG. 21, second photoresist patterns 292 may be formed between adjacent first photoresist patterns 286 on the conductive layer 260. Formation method and structure of the second photoresist patterns 292 may be substantially similar to the second photoresist patterns 278 and 284 described previously with reference to FIGS. 13 and 16, respectively, and therefore, will not be repeated. Each second photoresist pattern 292 may be between two adjacent and facing spacers 290, so the spacers 290 may define positions of the second photoresist patterns 292 between the first photoresist patterns 286.

Figure 22:
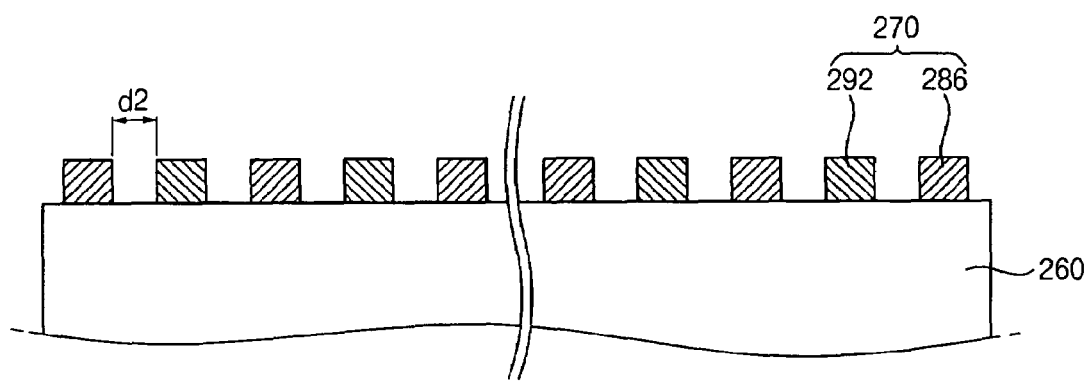

Referring to FIG. 22, the spacers 290 may be removed from the first photoresist patterns 286 after forming the second photoresist patterns 292. If the spacers include nitride, an etchant including phosphoric acid may be used to remove the spacers 290. After removal of the spacers 290, as illustrated in FIG. 22, the first and the second photoresist patterns 286 and 292 may be spaced apart from each other by a second distance d2, and may form the photoresist pattern structure 270 on the conductive layer 260. The second distance d2 may be substantially smaller than the first distance d1. The distance between adjacent first and second photoresist patterns 286 and 292 may vary in accordance with the width of the spacers 290.

FIGS. 23-28 illustrate cross-sectional views of a method of manufacturing a non-volatile semiconductor device in accordance with another embodiment of the present invention. FIGS. 23-28 illustrate a method of manufacturing a charge trapping type non-volatile semiconductor memory device 500, i.e., where a charge storage layer with charge trapping sites may store charges during programming/erasing operation. For example, charges, e.g., electrons, may be stored in the charge trapping sites of the charge storage layer in the programming operation of the charge trapping type non-volatile memory device, whereas other charges, e.g., holes, may replace the electrons in the charge trapping sites in the erasing operation of the charge trapping type non-volatile memory device. In FIGS. 23-28, the method of manufacturing the charge trapping type non-volatile memory device may be substantially similar to the method of manufacturing the floating gate type non-volatile memory device 100 described previously with reference to FIGS. 1-9, with the exception of gate structures 590.

Figure 23:
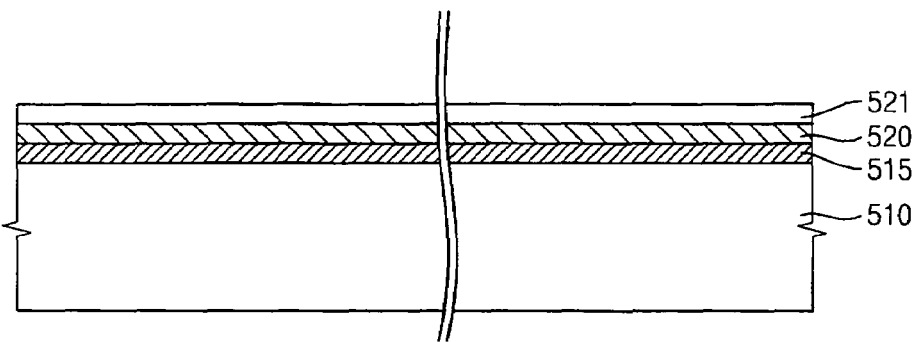
FIGS. 23-28 illustrate cross-sectional views of a method of manufacturing a non-volatile semiconductor device in accordance with another example embodiment of the present invention.

Referring to FIG. 23, a first insulation layer 515 may be formed on a semiconductor substrate 510, and then a charge storage layer 520 may be provided on the first insulation layer 515. A second insulation layer 521 may be formed on the charge storage layer 520. The first insulation layer 515 may have a substantially same structure and method of formation as the first insulation layer 205 of the floating gate type non-volatile memory device 100 described previously with reference to FIG. 1, and therefore, its detailed description will not be repeated.

The charge storage layer 520 may trap charges from a channel region (not illustrated) formed at an upper portion of the semiconductor substrate 510. The charge storage layer 520 may be formed using a nitride, e.g., silicon nitride, and/or a metal having a dielectric constant higher than the silicon nitride, e.g., one or more of hafnium oxide, tantalum oxide, zirconium oxide, aluminum oxide, and so forth. The charge storage layer 520 may be formed by, e.g., an LPCVD process, a PECVD process, an ALD process, and so forth. The charge storage layer 520 may have a multi layer structure having at least one silicon rich oxide film and at least one nano-crystalline silicon layer. The charge storage layer 520 may have a total thickness of about 20 angstroms to about 100 angstroms, e.g., 60 angstroms, as measured in an upward direction from an upper surface of the first insulation layer 510.

The second insulation layer 521 may electrically insulate the charge storage layer 520 from a conductive layer 565 (see FIG. 26) formed in a subsequent process. The second insulation layer 512 may include a nitride, e.g., silicon nitride, and/or a metal compound having a dielectric constant higher than the silicon nitride, e.g., one or more of aluminum nitride, aluminum oxide, titanium oxide, tantalum oxide, zirconium oxide, and so forth. The second insulation layer 512 may be formed by, e.g., a CVD process, an ALD process, a PLD process, a sputtering process, an evaporation process, and so forth, to a thickness of about 100 angstroms to about 400 angstroms as measured from an upper surface of the charge storage layer 520.

Figure 24:
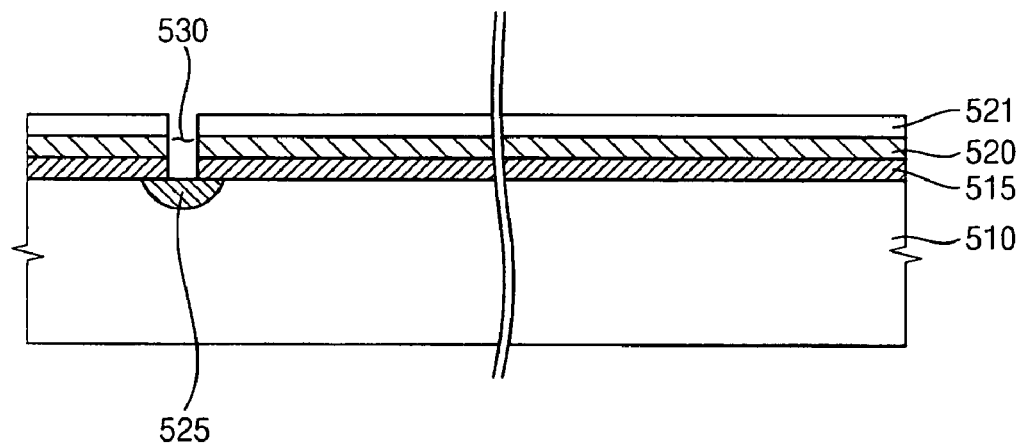

Referring to FIG. 24, the second insulation layer 521, the charge storage layer 520, and the first insulation layer 515 may be partially etched to form a first opening 530 to expose a first region 525 of the semiconductor substrate 510. The first opening 530 and the first region 525 may have substantially similar structures and methods of formation as the first opening 220 and the first region 215 of the floating gate type non-volatile memory device 100 described previously with reference to FIGS. 1-4, and therefore, their detailed description will not be repeated.

Figure 25:
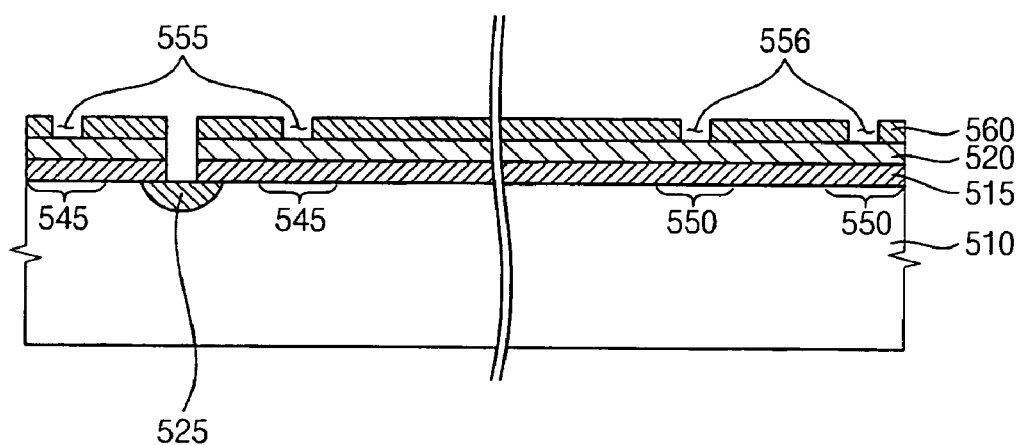

Referring to FIG. 25, portions of the second insulation layer 521 may be etched to form a second insulation layer pattern 560 on the charge storage layer 520. Second openings 555 and third openings 556 may be formed between portions of the insulation layer pattern 560. The second opening 555 may be positioned over a second region 545 of the semiconductor substrate 510, and the third opening 556 may be formed over a third region 550 of the semiconductor substrate 510. Portions of an upper surface of the charge storage layer 520 may be exposed through the second and the third openings 555 and 556. The second and the third openings 555 and 556 may have substantially similar structures and methods of formation as the second and third openings 250 and 251 of the floating gate type non-volatile memory device 100 described previously with reference to FIG. 5, and therefore, their detailed description will not be repeated.

Figure 26:
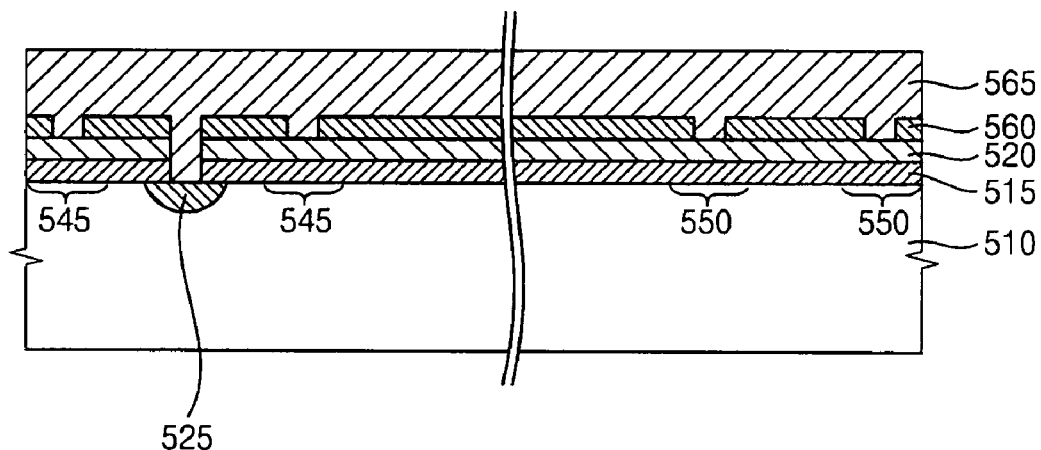

Referring to FIG. 26, a conductive layer 565 may be formed on the second insulation layer pattern 560 to fill up the first opening 530, the second opening 550, and the third opening 556. The conductive layer 565 may be formed of, e.g., one or more of doped polysilicon, a metal, and/or a metal compound, by, e.g., a CVD process, a sputtering process, an ALD process, an evaporation process, a PLD process, and so forth. For example, the conductive layer 565 may be formed using one or more of titanium, aluminum, tungsten, tantalum, nickel, titanium silicide, tantalum silicide, nickel silicide, titanium nitride, aluminum nitride, tungsten nitride, and so forth. The conductive layer 565 may have a multi layer structure, e.g., a structure including a metal film, a metal nitride film, and/or a metal silicide film.

Figure 27:
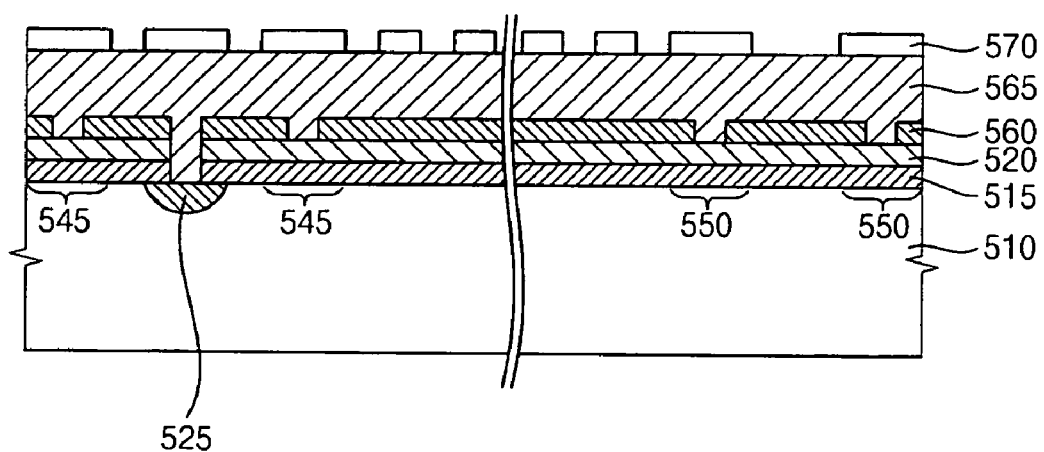

Referring to FIG. 27, a photoresist pattern structure 570 may be formed on the conductive layer 565. The photoresist pattern structure 570 may be formed by a double patterning process, e.g., any of the process described previously with references to FIGS. 10-22. Thus, the photoresist pattern structure 570 may have a fine pitch.

Figure 28:
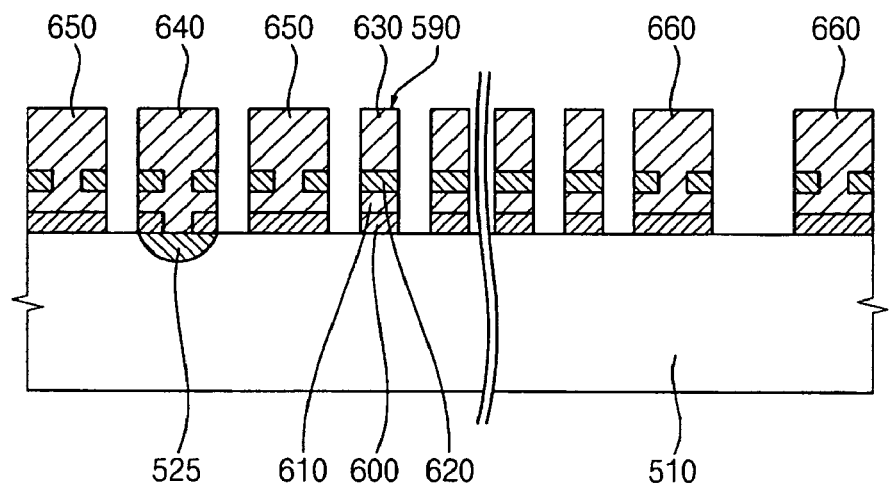

Referring to FIG. 28, the conductive layer 565, the second insulation layer pattern 560, the charge storage layer 520 and the first insulation layer 515 may be partially etched using the photoresist pattern structure 570 as an etching mask. Hence, the gate structures 590, a common source line 640, ground selection lines 650, and string selection lines 660 may be simultaneously formed on the semiconductor substrate 510. The gate structures 590 may be disposed in a central region of the semiconductor substrate 510, whereas the common source line 640, the ground selection lines 650, and the string selection lines 660 may be positioned in a peripheral region of the semiconductor substrate 510. Since the common source line 640 may be formed simultaneously with the gate structures 590, the ground selection lines 650, and the string selection lines 660, a processing time and a processing cost for manufacturing the charge trapping type non-volatile memory device may be considerably reduced.

An insulating interlayer (not illustrated) may be formed on the semiconductor substrate 510 to cover the gate structures 590, the common source line 640, the ground selection lines 650, and the string selection lines 660. The insulating interlayer may be partially etched to form a contact hole (not illustrated) exposing a fourth region of the semiconductor substrate 510. A contact (not illustrated) may be formed in the contact hole, as described previously with reference to FIG. 9.

The contact may be formed through the insulating interlayer so that the contact may have a relatively small aspect ratio to ensure a precise formation of the contact in the fourth region of the semiconductor substrate 510. Therefore, the charge trapping type non-volatile memory device may have improved electrical characteristics and reliability.

Figure 29:
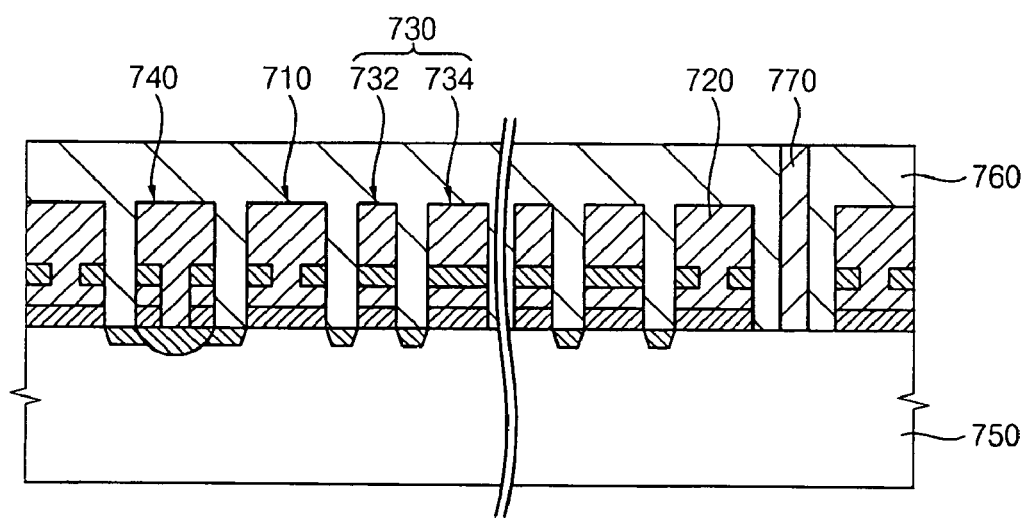
FIG. 29 illustrates a cross-sectional view of a non-volatile semiconductor device in accordance with another example embodiment of the present invention.

FIG. 29 illustrates a cross-sectional view of a non-volatile semiconductor device in accordance with another embodiment of the present invention. Referring to FIG. 29, a non-volatile memory device 700 may include at least one ground selection line 710, at least one string selection line 720, a plurality of gate structures 730, and a common source line 740.

The gate structures 730 may include first gate structures 732 and second gate structures 734, and may be disposed in a central region of a substrate 750. The first and the second gate structures 732 and 734 may be alternately positioned on the substrate 750 with a fine pitch therebetween, i.e., the gate structures 730 may be formed by a double patterning process substantially similar to the process described previously with reference to FIGS. 10-22. Thus, the non-volatile memory device 700 may have an improved integration degree.

The second gate structures 734 may have substantially different shapes as compared to the first gate structures 732. For example, the second gate structures 734 may be narrower than the first gate structures 732. Each of the first and the second gate structures 732 and 734 may include a first insulation layer pattern, a charge storage layer pattern, a second insulation layer pattern, and a conductive layer pattern sequentially formed on the substrate 750.

The ground selection line 710 and the string selection line 720 may be formed on opposite sides of the semiconductor substrate 750, such that the gate structures 730 may be centered between the ground and string selection lines 710 and 720, e.g., the ground selection line 710 and the string selection line 720 may be disposed at a peripheral region of the substrate 750, as described previously with reference to FIG. 9. The common source line 740 may be disposed between two adjacent ground selection lines 710. As described previously with reference to FIGS. 8-9, the common source line 740 may be formed together with the gate structures 730. Further, the common source line 740 may be positioned in a first region of the substrate 750, and the ground selection line 710 may be positioned in a second region of the substrate 750. The string selection line 720 may be disposed in a third region of the substrate 750. The common source line 740 may be on a substantially same level as the gate structures 730, e.g., both the common source line 740 and the gate structures 730 may be directly on the semiconductor substrate 750. Further, the common source line 740 may include substantially same components as the gate structures 730, i.e., a first insulation layer pattern, a charge storage layer pattern, a second insulation layer pattern, and a conductive layer pattern sequentially formed on the substrate 750, as described previously with reference to FIG. 8.

An insulating interlayer 760 may be formed on the substrate 750 to cover the common source line 740, the ground selection line 710, the string selection line 720 and the gate structures 730. A contact 770 may be formed through a portion of the insulating interlayer 760 adjacent to the string selection line 720.

A method of manufacturing a non-volatile memory device according to embodiments of the present invention may be advantageous in simultaneously forming a common source line and gate structures on a substrate. Thus, processing time and costs for the non-volatile memory device may be greatly reduced. Further, the non-volatile memory device may have enhanced electrical characteristics and reliability because a contact may be formed with increased precision through a single insulating interlayer and may have a relatively small aspect ratio, and the gate structures of the non-volatile memory device may be formed with a desired fine pitch.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a non-volatile memory device, comprising:
   forming a multi-layer structure on a substrate by sequentially depositing a first insulation layer, a charge storage layer, and a second insulation layer on the substrate;
   forming a first opening through the multi-layer structure to expose a first region of the substrate, the first opening being formed by partially etching the second insulation layer, the charge storage layer, and the first insulation layer;
   forming second and third openings through the second insulation layer to form a second insulation layer pattern, the second and the third openings being formed in first and second sections of the substrate, respectively, and exposing portions of the charge storage layer, the first section of the substrate including the first region of the substrate;
   forming a conductive layer on the second insulation layer pattern;
   forming a photoresist pattern structure on the conductive layer; and
   forming simultaneously a common source line, at least one ground selection line, at least one string selection line, and a plurality of gate structures on the substrate by etching the conductive layer, the second insulation layer pattern, the charge storage layer, and the first insulation layer using the photoresist pattern structure as an etching mask,
   wherein the common source line is formed in the first region of the substrate, the ground selection line is formed in the first section and adjacent to the common source line, the string selection line is formed in the second section, and the gate structures are in a central region of the substrate between the first and the second sections.

2. The method as claimed in claim 1, wherein forming the photoresist pattern structure includes,
   forming a first photoresist film on the conductive layer;
   patterning the first photoresist film to form first photoresist patterns spaced apart by a first distance;
   forming a second photoresist film on the first photoresist patterns and on the conductive layer; and
   patterning the second photoresist film to form second photoresist patterns between the first photoresist patterns, such that an alternating pattern of the first and the second photoresist patterns is formed, each first photoresist pattern being spaced apart from an adjacent second photoresist pattern by a second distance substantially smaller than the first distance.

3. The method as claimed in claim 2, wherein each of the first and the second photoresist patterns has a width corresponding to a resolution limit of a light used in patterning the first and the second photoresist films.

4. The method as claimed in claim 2, further comprising forming a reaction preventing layer on the conductive layer and on the first photoresist patterns before forming the second photoresist film.

5. The method as claimed in claim 4, wherein the reaction preventing layer is formed by treating the first photoresist patterns with a hydrogen bromide (HBr) plasma.

6. The method as claimed in claim 4, further comprising treating the second photoresist patterns with a hydrogen bromide plasma.

7. The method as claimed in claim 2, further comprising forming spacers on sidewalls of the first photoresist patterns before forming the second photoresist film.

8. The method as claimed in claim 7, wherein forming the spacers includes,
   forming a spacer formation layer on the conductive layer to cover the first photoresist patterns; and
   anisotropically etching the spacer formation layer.

9. The method as claimed in claim 1, further comprising implanting impurities into the first region of the substrate.

10. The method as claimed in claim 9, wherein implanting the impurities is performed before forming the first insulation layer.

11. The method as claimed in claim 9, wherein implanting the impurities is performed after forming the first opening.

12. The method as claimed in claim 1, wherein the first insulation layer includes silicon oxide.

13. The method as claimed in claim 1, wherein the charge storage layer includes polysilicon or amorphous silicon.

14. The method as claimed in claim 13, wherein the second insulation layer includes a silicon oxide, a silicon nitride, or a metal compound.

15. The method as claimed in claim 1, wherein the charge storage layer includes a silicon nitride or a metal compound having a dielectric constant substantially higher than that of a silicon oxide.

16. The method as claimed in claim 15, wherein the second insulation layer includes a silicon oxide, a silicon oxynitride, or a metal compound having a dielectric constant substantially higher than that of a silicon nitride.

17. The method as claimed in claim 16, wherein the second insulation layer includes a metal compound, the metal compound being an aluminum oxide.

18. The method as claimed in claim 1, further comprising:

forming an insulating interlayer on the substrate to cover the gate structures, the ground selection line, the string selection line, and the common source line;

partially etching the insulating interlayer to form a contact hole exposing a portion of the substrate; and forming a contact in the contact hole.

19. The method as claimed in claim 18, wherein forming the contact hole includes arranging the string selection line between the contact hole and the gate structures.

* * * * *